United States Patent
Wu et al.

(10) Patent No.: US 9,177,830 B1
(45) Date of Patent: Nov. 3, 2015

(54) SUBSTRATE WITH BUMP STRUCTURE AND MANUFACTURING METHOD THEREOF

(71) Applicant: CHIPBOND TECHNOLOGY CORPORATION, Hsinchu (TW)

(72) Inventors: Fei-Jain Wu, Hsinchu County (TW); Tsang-Sheng Liao, Yilan County (TW); Ching-Yi Huang, Yunlin County (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 14/529,246

(22) Filed: Oct. 31, 2014

(30) Foreign Application Priority Data

Jul. 25, 2014 (TW) .............................. 103125555 A

(51) Int. Cl.
*H01L 21/44* (2006.01)
*H01L 23/48* (2006.01)

(52) U.S. Cl.
CPC ............... *H01L 21/44* (2013.01); *H01L 23/48* (2013.01)

(58) Field of Classification Search
CPC ............. H01L 2224/3225; H01L 2224/73267; H01L 2224/8203; H01L 2224/04105; H01L 2224/24226; H01L 2224/92244; H01L 24/25; H01L 24/82; H01L 24/24
USPC ......... 438/106–109, 112–113, 124, 127, 613, 438/612, 614, 617; 257/737–738, 777–781, 257/784
See application file for complete search history.

(56) References Cited

U.S. PATENT DOCUMENTS

| | | | |
|---|---|---|---|
| 2003/0030142 A1* | 2/2003 | Nakatani | ........................ 257/737 |
| 2006/0094224 A1 | 5/2006 | Huang et al. | |
| 2007/0241463 A1* | 10/2007 | Yamaguchi et al. | .......... 257/777 |
| 2009/0096092 A1 | 4/2009 | Patel | |
| 2010/0109159 A1 | 5/2010 | Ho et al. | |
| 2011/0049706 A1 | 3/2011 | Huang et al. | |
| 2011/0101527 A1 | 5/2011 | Cheng et al. | |
| 2012/0043654 A1 | 2/2012 | Lu et al. | |
| 2012/0164854 A1 | 6/2012 | Wang | |
| 2013/0127045 A1 | 5/2013 | Lin et al. | |
| 2013/0221520 A1 | 8/2013 | Uno et al. | |

FOREIGN PATENT DOCUMENTS

| | | |
|---|---|---|
| CN | 102800599 A | 11/2012 |
| TW | 201248804 A1 | 12/2012 |

OTHER PUBLICATIONS

Singaporean Office Action mailed Jun. 22, 2015 for Singaporean Patent Application No. 10201407629Y, 20 pages.
Korean Office Action mailed Aug. 10, 2015 for Korean Patent Application No. 10-2014-0113820, 6 pages.

* cited by examiner

*Primary Examiner* — Hoa B Trinh
(74) *Attorney, Agent, or Firm* — Jackson IPG PLLC; Demian K. Jackson

(57) ABSTRACT

A manufacturing method of a substrate with a bump structure, a copper layer is formed on a semiconductor substrate, and a nickel layer is formed on the copper layer. A bump structure is composed of the copper layer and the nickel layer, wherein the hardness of the bump structure after annealing process depends on the thickness of the nickel layer to meet the user's demand. The hardness of the bump structure meets the user's demand prevents a glass substrate from cracking when the substrate with the bump structure is bonded with the glass substrate.

6 Claims, 5 Drawing Sheets

SUBSTRATE WITH BUMP STRUCTURE AND MANUFACTURING METHOD THEREOF

FIELD OF THE INVENTION

The present invention is generally relating to a substrate with a bump structure and manufacturing method thereof, particularly to the substrate with bump structure composed of copper layer and nickel layer. The hardness of the bump structure enables to meet the user's demand after annealing process by adjusting the thickness of nickel layer.

BACKGROUND OF THE INVENTION

In flip-chip package technology, at least one bump is formed on an active surface of a chip, afterwards, the chip is flip-chip bonded with a glass substrate by the bump. The material of the bump is selected from gold or copper. However, the material of the bump is mainly chosen from copper because of the rising gold price. When the chip is flip-chip bonded with the glass substrate by a copper bump, the copper bump leads the glass substrate to crack because the hardness of the copper is higher than the gold.

SUMMARY

The primary object of the present invention is to provide a substrate with a bump structure and manufacturing method thereof. By adjusting the thickness of a nickel layer formed on a copper layer, the hardness of the bump structure composed of the copper layer and the nickel layer enables to meet the user's demand after annealing process, which prevents a glass substrate from cracking when the substrate with the bump structure is bonded with the glass substrate.

A manufacturing method of a substrate with a bump structure in the present invention includes providing a semiconductor substrate, forming an under bump metallurgy layer, forming a photoresist layer, patterning the photoresist layer, forming a copper layer, forming a nickel layer, removing the photoresist layer and removing a pre-removed portion of the under bump metallurgy layer. In the step of providing a semiconductor substrate, the semiconductor substrate comprises a base, at least one conductive pad and a protective layer, wherein the at least one conductive pad is formed on the base, and the protective layer covers the base and comprises at least one first opening for revealing the at least one conductive pad. In the step of forming an under bump metallurgy layer, the under bump metallurgy layer covers the protective layer and the at least one conductive pad, wherein the under bump metallurgy layer electrically connects to the at least one conductive pad and includes a pre-retained portion and a pre-removed portion. In the step of forming a photoresist layer, the photoresist layer covers the under bump metallurgy layer. In the step of patterning the photoresist layer, the photoresist layer is patterned, wherein the patterned photoresist layer comprises at least one second opening for revealing the pre-retained portion of the under bump metallurgy layer. In the step of forming a copper layer, the copper layer is formed within the at least one second opening of the photoresist layer and electrically connects to the pre-retained portion of the under bump metallurgy layer. In the step of forming a nickel layer, the nickel layer is formed within the at least one second opening of the photoresist layer, wherein the nickel layer is formed on top of the copper layer and electrically connects to the copper layer. A bump structure is composed of the nickel layer and the copper layer. The nickel layer comprises a top surface and a bottom surface, a vertical distance between the top surface and the bottom surface is the thickness of the nickel layer, wherein the thickness of the nickel layer depends on a calculation formula $H=12.289D+96.674$, H means the hardness of the bump structure after annealing process, the unit of the hardness of the bump structure after annealing process is Hv, D means the thickness of the nickel layer, and the unit of the thickness of the nickel layer is um. In the step of removing the photoresist layer, the photoresist layer is removed for revealing the pre-removed portion of the under bump metallurgy layer. Eventually in the step of removing the pre-removed portion of the under bump metallurgy layer, the pre-removed portion of the under bump metallurgy layer is removed by using the bump structure as a mask, and only the pre-retained portion of the under bump metallurgy layer is retained.

In the present invention, the hardness of the bump structure after annealing process enables to meet the user's demand by adjusting the thickness of the nickel layer of the bump structure to prevent a glass substrate from cracking when the substrate with the bump structure is flip-chip bonded with the glass substrate.

DETAILED DESCRIPTION OF THE INVENTION

Figure 1A:
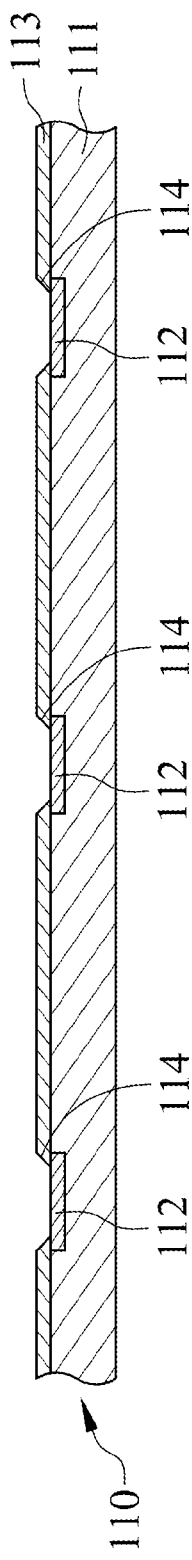
FIGS. 1A to 1H are sectional view diagrams illustrating the manufacturing method of a substrate with a bump structure in accordance with the present invention.
Figure 1B:
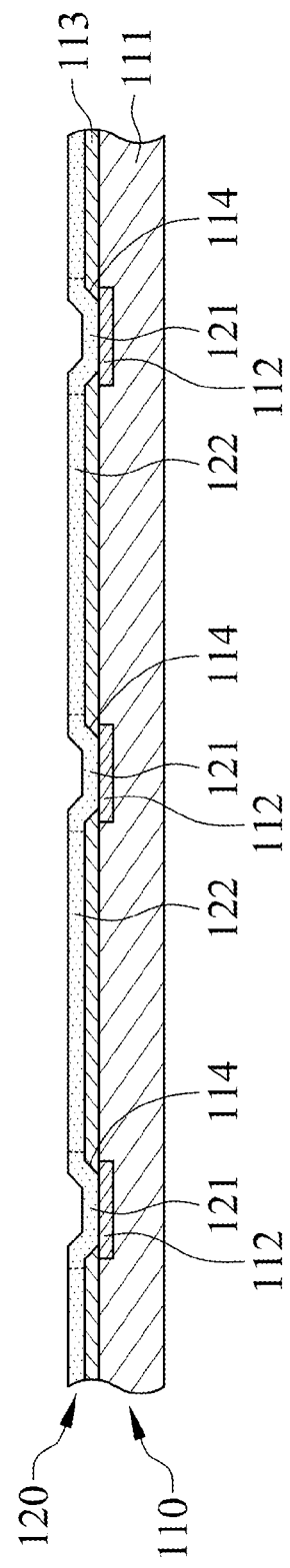
Figure 1C:
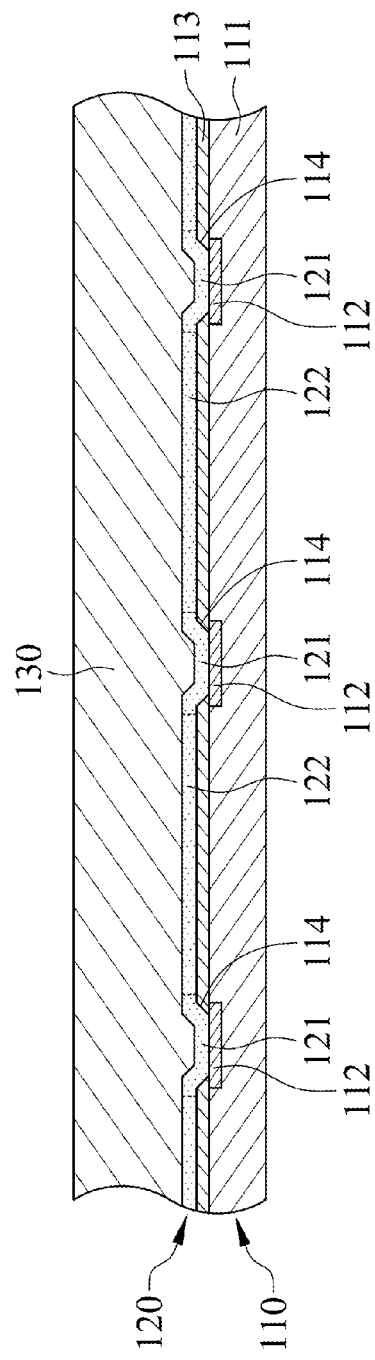
Figure 1D:
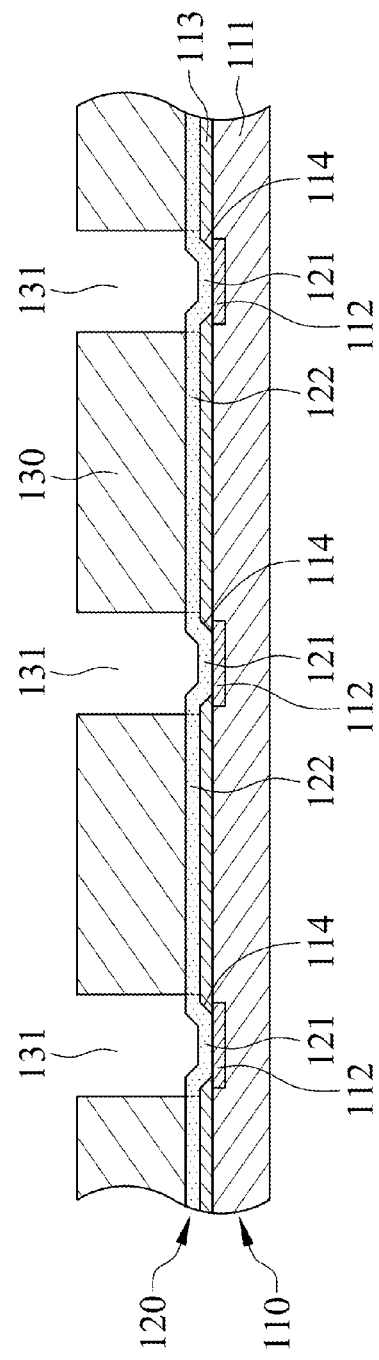
Figure 1E:
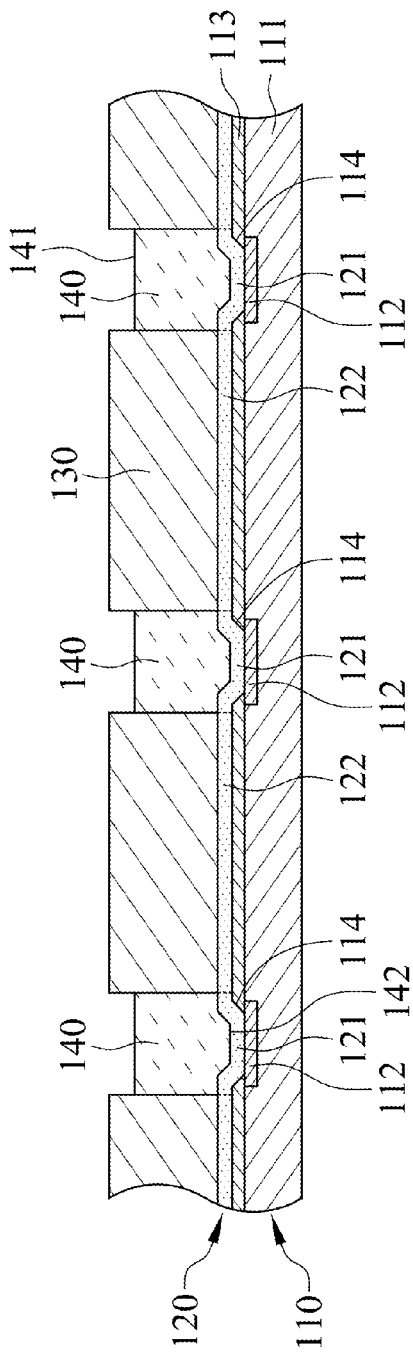
Figure 1F:
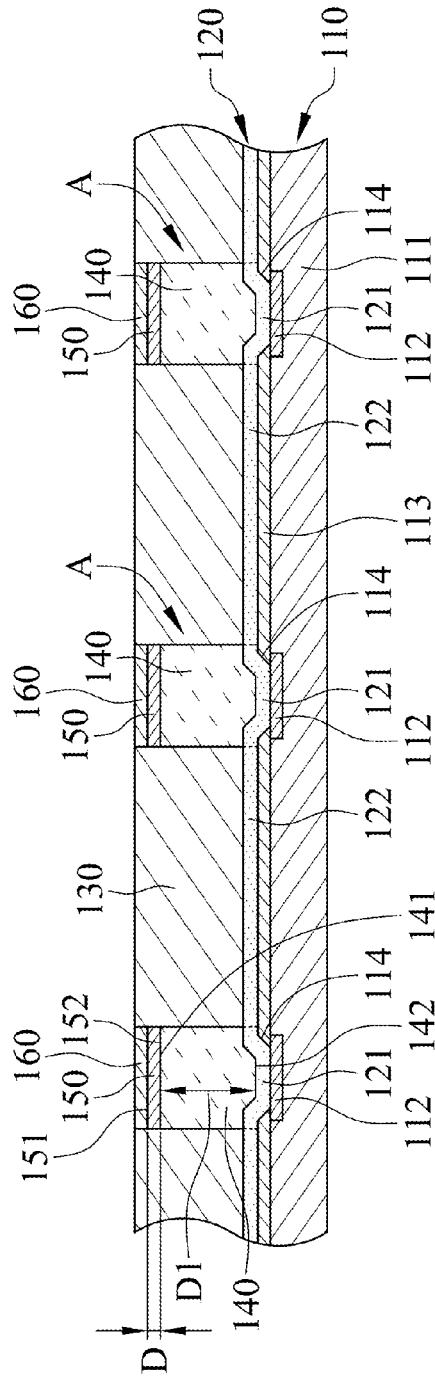
Figure 1G:
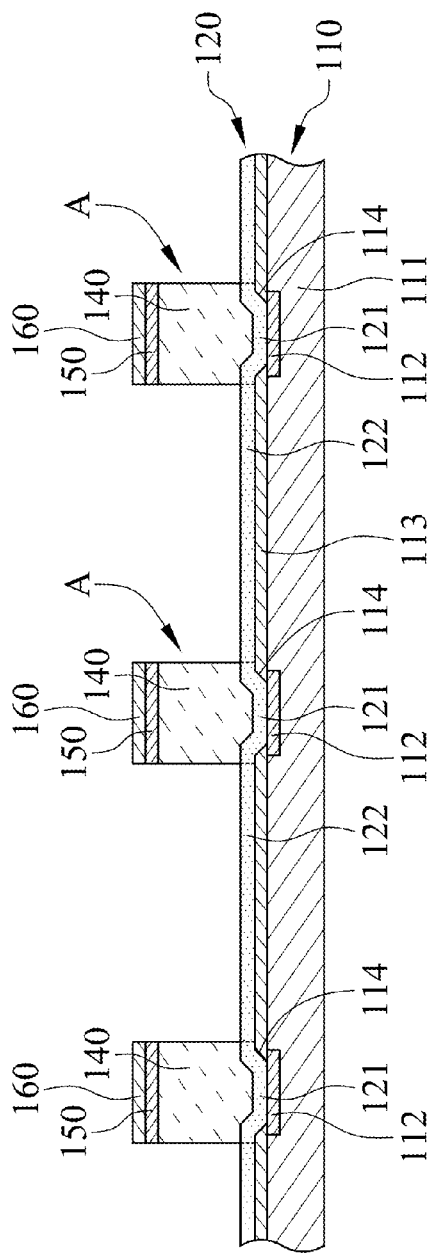
Figure 1H:
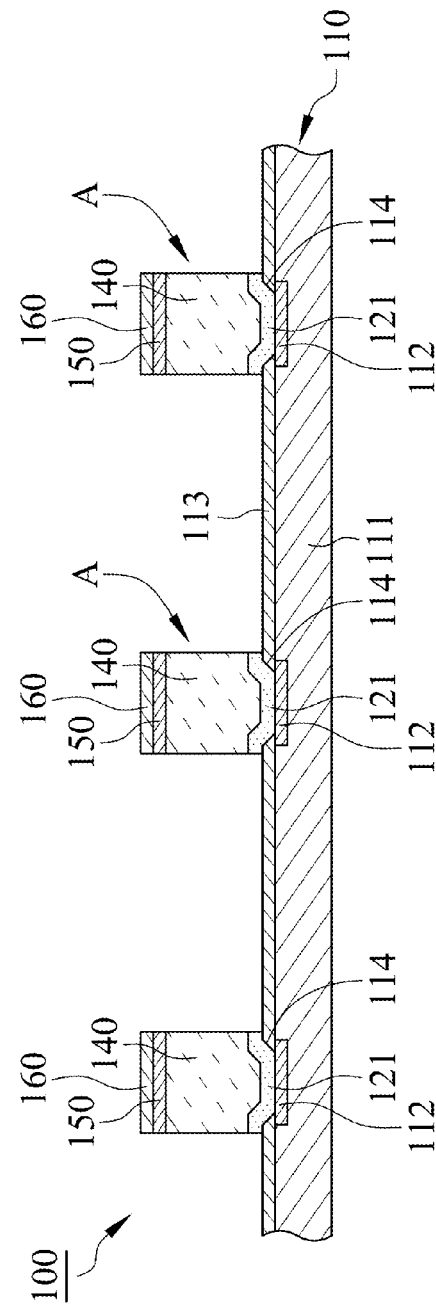

With reference to FIGS. 1A to 1H, a manufacturing method of a substrate with a bump structure includes the step of providing a semiconductor substrate in FIG. 1A, the step of forming an under bump metallurgy layer in FIG. 1B, the step of forming a photoresist layer in FIG. 1C, the step of patterning the photoresist layer in FIG. 1D, the step of forming a copper layer in FIG. 1E, the step of forming a nickel layer in FIG. 1F, the step of removing the photoresist layer in FIG. 1G and the step of removing a pre-removed portion of the under bump metallurgy layer in FIG. 1H.

First, referring to FIG. 1A, in the step of providing a semiconductor substrate, the semiconductor substrate 110 comprises a base 111, at least one conductive pad 112 and a protective layer 113, wherein the at least one conductive pad 112 is formed on the base 111, and the protective layer 113 covers the base 111 and comprises at least one first opening 114 for revealing the at least one conductive pad 112. The material of the conductive pad is selected from one of copper, aluminum, copper alloy or other conductive material.

Next, referring to FIG. 1B, in the step of forming an under bump metallurgy layer, the under bump metallurgy layer 120 covers the protective layer 113 and the at least one conductive pad 112, and electrically connects to the at least one conductive pad 112. The under bump metallurgy layer 120 includes a pre-retained portion 121 and a pre-removed portion 122, wherein the pre-retained portion 121 connects to the at least one conductive pad 112.

Afterwards, referring to FIG. 1C, in the step of forming a photoresist layer, the photoresist layer 130 selected from positive photoresist film or negative photoresist film covers the under bump metallurgy layer 120. The photoresist layer 130 is formed on the under bump metallurgy layer 120 by coating or curing process.

Next, referring to FIG. 1D, in the step of patterning the photoresist layer, the photoresist layer 130 is patterned by photolithography and etching (dry etching or wet etching) technologies, the patterned photoresist layer 130 comprises at least one second opening 131 for revealing the pre-retained portion 121 of the under bump metallurgy layer 120.

Afterwards, referring to FIG. 1E, in the step of forming a copper layer, the copper layer 140 is formed within the at least one second opening 131 of the photoresist layer 130 by electroplate, electroless plating, printing, sputtering or chemical vapor deposition (CVD), wherein the copper layer 140 comprises an top side 141 and a bottom side 142 electrically connects to the pre-retained portion 121 of the under bump metallurgy layer 120. In this embodiment, the bottom side 142 of the copper layer 140 is contacted with the pre-retained portion 121 of the under bump metallurgy layer 120.

Next, referring to FIG. 1F, in the step of forming a nickel layer, the nickel layer 150 is formed within the at least one second opening 131 of the photoresist layer 130 by electroplate, electroless plating, printing, sputtering or chemical vapor deposition (CVD), the nickel layer 150 is formed on top of the copper layer 140 and electrically connects to the copper layer 140. In this embodiment, the nickel layer 150 contacts with the top side 141 of the copper layer 140, wherein a bump structure A is composed of the nickel layer 150 and the copper layer 140. In the step of forming the nickel layer 150, the thickness of the nickel layer 150 depends on a calculation formula $H=12.289D+96.674$, wherein H means the hardness of the bump structure A after annealing process, the unit of the hardness of the bump structure A after annealing process is Hv, and D means the thickness of the nickel layer 150, the unit of the thickness D of the nickel layer 150 is um. The nickel layer 150 comprises a top surface 151 and a bottom surface 152, a vertical distance between the top surface 151 and the bottom surface 152 is the thickness D of the nickel layer 150.

Referring to FIG. 1F, in the step of forming a nickel layer, if the hardness of the bump structure A is intended to meet the user's demand, the thickness D of the nickel layer 150 has to be determined by the calculation formula $H=12.289D+96.674$, which prevents the thickness D of the nickel layer 150 from being too thick or too thin to produce the bump structure A with the hardness H different from user's demand after annealing process, and also prevent the hardness H of the bump structure A after annealing process from being out of control because the uncertainty thickness D of the nickel layer 150. Besides, a vertical distance between the top side 141 and the bottom side 142 is the thickness D1 of the copper layer 140, preferably, the thickness D1 of the copper layer 140 is not smaller than the thickness D of the nickel layer 150.

Referring to FIG. 1F, in this embodiment, a connection layer 160 is formed within the at least one second opening 131 of the photoresist layer 130 by one of electroplate, electroless plating, printing, sputtering or chemical vapor deposition (CVD) after forming the nickel layer 150, wherein the connection layer 160 is formed on the top surface 151 of the nickel layer 150. The material of the connection layer 160 is selected from one of gold (Au), tin (Sn), tin-lead (SnPb), silver (Ag) or other similar material.

With reference to FIG. 1G, in the step of removing the photoresist layer, the photoresist layer 130 is removed for revealing the pre-removed portion 122 of the under bump metallurgy layer 120.

With reference to FIG. 1H, in the step of removing the pre-removed portion of the under bump metallurgy layer, the pre-removed portion 122 of the under bump metallurgy layer 120 is removed by using the bump structure A as a mask, and the pre-retained portion 121 right below the bump structure A is retained so as to form a substrate 100 with the bump structure A.

Figure 2:
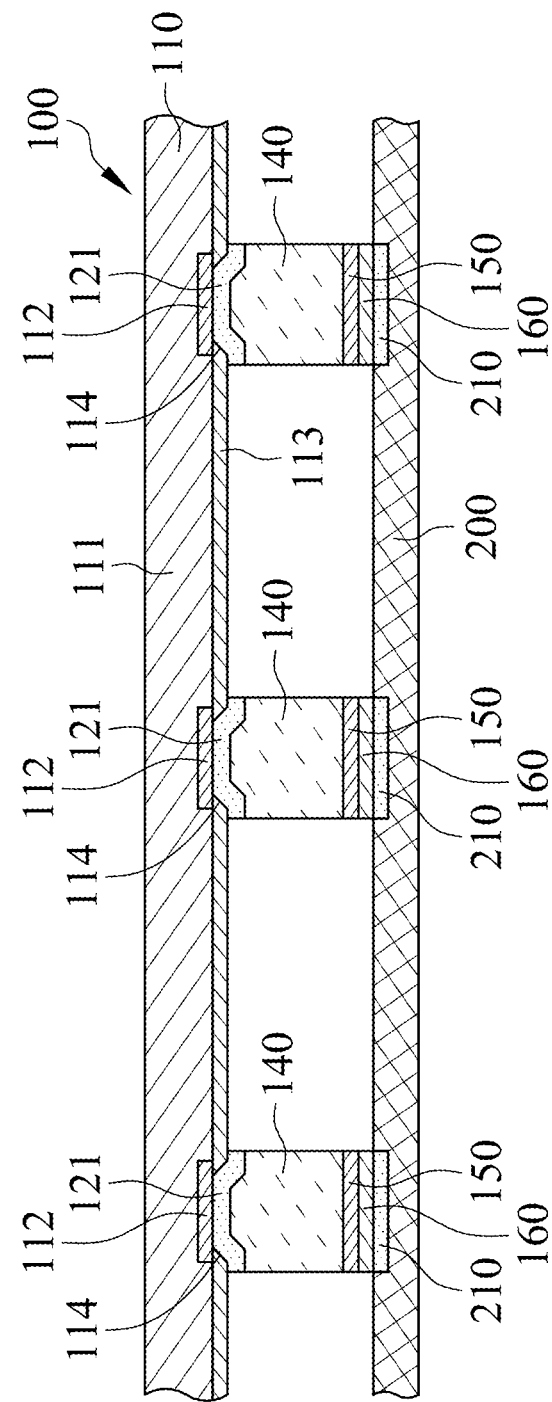
FIG. 2 is a sectional view diagram illustrating the substrate with the bump structure bonded with a glass substrate in accordance with the present invention.

Referring to FIG. 2, the substrate 100 with the bump structure A is flip-chip bonded with a glass substrate 200 having at least one connection point 210. Because the hardness H of the bump structure A meets the user's demand after annealing process is determined by the thickness D of the nickel layer 150 of the bump structure A, wherein the nickel layer 150 depends on the calculation formula $H=12.289D+96.674$, so the glass substrate 200 prevents from cracking because of the hardness H of the bump structure A difference with different from user's demand when the substrate 100 with the bump structure is flip-chip bonded with the glass substrate 200.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A manufacturing method of a substrate with a bump structure includes:

providing a semiconductor substrate having a base, at least one conductive pad and a protective layer, wherein the at least one conductive pad is formed on the base, the protective layer covers the base and comprises at least one first opening for revealing the at least one conductive pad;

forming an under bump metallurgy layer for covering the protective layer and the at least one conductive pad, wherein the under bump metallurgy layer electrically connects to the at least one conductive pad and includes a pre-retained portion and a pre-removed portion;

forming a photoresist layer for covering the under bump metallurgy layer;

patterning the photoresist layer, the patterned photoresist layer comprises at least one second opening for revealing the pre-retained portion of the under bump metallurgy layer;

forming a copper layer within the at least one second opening of the photoresist layer, the copper layer electrically connects to the pre-retained portion of the under bump metallurgy layer;

forming a nickel layer within the at least one second opening of the photoresist layer, the nickel layer is formed on top of the copper layer and electrically connects to the copper layer, wherein a bump structure is composed of the nickel layer and the copper layer, the nickel layer comprises a top surface and a bottom surface, a vertical distance between the top surface and the bottom surface is the thickness of the nickel layer, wherein the thickness of the nickel layer depends on a calculation formula $H=12.289D+96.674$, H means the hardness of the bump structure after annealing process, the unit of the hardness of the bump structure after annealing process is Hv, D means the thickness of the nickel layer, and the unit of the thickness of the nickel layer is um;

removing the photoresist layer for revealing the pre-removed portion of the under bump metallurgy layer; and removing the pre-removed portion of the under bump metallurgy layer by using the bump structure as a mask to retain the pre-retained portion of the under bump metallurgy layer.

2. The manufacturing method of a substrate with a bump structure in accordance with claim 1, wherein the copper layer comprises a top side and a bottom side, a vertical distance between the top side and the bottom side is the thickness of the copper layer, wherein the thickness of the copper layer is not smaller than the thickness of the nickel layer.

3. The manufacturing method of a substrate with a bump structure in accordance with claim 1, wherein between the step of forming the nickel layer and the step of removing the photoresist layer, a connection layer is formed within the at least one second opening of the photoresist layer, and the connection layer is formed on the top surface of the nickel layer.

4. A substrate with a bump structure with a predetermined hardness after annealing process includes:
- a semiconductor substrate having a base, at least one conductive pad and a protective layer, wherein the at least one conductive pad is formed on the base, the protective layer covers the base and comprises at least one first opening for revealing the at least one conductive pad;
- an under bump metallurgy layer electrically connects to the at least one conductive pad; and
- a bump structure including a copper layer and a nickel layer, the copper layer electrically connects to the under bump metallurgy layer and locates between the under bump metallurgy layer and the nickel layer, the nickel layer comprises a top surface and a bottom surface, a vertical distance between the top surface and the bottom surface is the thickness of the nickel layer, wherein the thickness of the nickel layer depends on a calculation formula H=12.289D+96.674, H means the hardness of the bump structure after annealing process, the unit of the hardness of the bump structure after annealing process is Hv, D means the thickness of the nickel layer, and the unit of the thickness of the nickel layer is um.

5. The substrate with a bump structure in accordance with claim 4, wherein the copper layer comprises a top side and a bottom side, a vertical distance between the top side and the bottom side is the thickness of the copper layer, wherein the thickness of the copper layer is not smaller than the thickness of the nickel layer.

6. The substrate with a bump structure in accordance with claim 4 further includes a connection layer formed on the top surface of the nickel layer.

* * * * *